United States Patent [19]

Shapiro

[11] 4,447,798
[45] May 8, 1984

[54] PROCESSOR SELECT SWITCH

[75] Inventor: Ira P. Shapiro, Phoenixville, Pa.

[73] Assignee: Burroughs Corporation, Detroit, Mich.

[21] Appl. No.: 240,142

[22] Filed: Mar. 3, 1981

[51] Int. Cl.³ .......................................... H03K 21/30
[52] U.S. Cl. ...................................... 377/55; 377/90; 340/364
[58] Field of Search .............. 235/92 A, 92 K, 92 PE, 235/92 DE, 92 ST, 92 SH, 92 TE, 103, 145 R; 328/48; 307/220 R; 340/363, 364, 365 S; 364/705; 377/17, 33, 37, 54–56, 86, 88, 90

[56] References Cited

U.S. PATENT DOCUMENTS

| 3,534,398 | 10/1970 | Wajda | 328/48 |
|---|---|---|---|
| 3,564,217 | 2/1971 | Bounsall | 235/92 PE |
| 3,784,979 | 1/1974 | Friedman et al. | 235/92 ST |
| 3,928,789 | 12/1975 | Elias | 340/365 S |
| 3,976,859 | 8/1976 | Christie et al. | 377/37 |
| 4,060,242 | 11/1977 | Huang et al. | 377/55 |
| 4,193,539 | 3/1980 | Bowman et al. | 235/92 SH |
| 4,229,647 | 10/1980 | Burkhardt | 235/92 PE |
| 4,347,434 | 8/1982 | Kovalick | 235/92 SH |

Primary Examiner—Gary Chin
Attorney, Agent, or Firm—Mark T. Starr; Edmund M. Chung; Kevin R. Peterson

[57] ABSTRACT

An n-position selector switch includes a binary counter which is clocked in response to a user actuated pushbutton type input. The counter's output is fed into a decoder, the output of which drives a visual display indicating the selected switch position. A detector at the counter output responds to a data pattern indicative of selection of the nth-switch position by initiating a counter load operation which resets the counter on the occurrence of the next pushbutton actuation.

9 Claims, 1 Drawing Figure

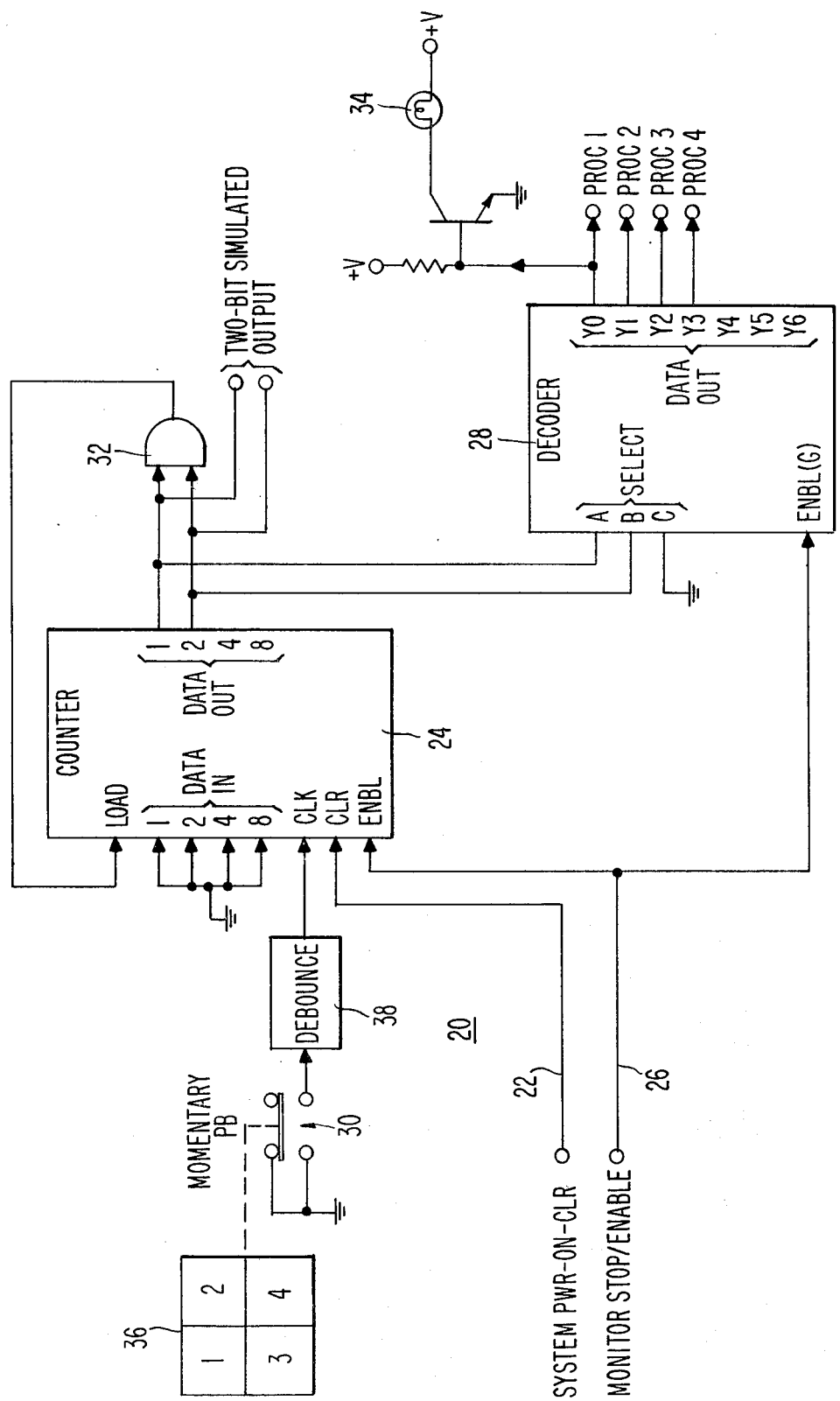

PROCESSOR SELECT SWITCH

CROSS-REFERENCE TO RELATED APPLICATION

Reference is hereby made to a pending U.S. patent application entitled ROTARY SWITCH SIMULATOR, Ser. No. 229,551, filed Jan. 29, 1981, by the same inventor as the instant application and assigned to the same assignee as the instant application.

BACKGROUND OF THE INVENTION

The present invention pertains to a pushbutton-actuated counting selector switch which provides an ordered set of n outputs, the next sequential output being selected and visually identified each time the pushbutton is actuated, the sequence of outputs being repeated after n sequential pushbutton actuations.

In the prior art, various approaches have been used to detect that a counter has reached a certain value and then reset the counter to some new value. Thus, in U.S. Pat. No. 3,962,565, issued June 8, 1976 to Bao-Dam N. Guyen-Phuoc, an apparatus is provided which automatically presets an electric pulse counter to a predetermined initial count. The apparatus includes a pulse generator which is connected during a preset operation to the count input of the counter through an electronic gate. The electronic gate, in response to an auxiliary circuit detecting an overflow at the output of the pulse counter, actuates the pulse generator, which increments the pulse counter until the desired preset value is obtained. The above described technique, although quite useful when working at high frequencies, for example over 100 MHz., is also quite costly and complex when such high frequency operation is not required.

In U.S. Pat. No. 4,150,337 issued Apr. 17, 1979, an up-down counter output is prevented from overflowing or underflowing by stopping it when all of the counter output digits are at the same one of a plurality of possible logic levels. The detection of such a condition is accomplished by comparing the logic value of each of the digits with the logic value of at least one other digit and providing a stop signal when all the comparisons are equal. The above described technique suffers from the fact that it requires a relatively large amount of logic to implement and further from the fact that it is limited to detecting only the maximum count possible for the counter being utilized.

In pending U.S. patent application Ser. No. 229,551, a selector switch is disclosed which simulates an n-position rotary-type switch. The selector switch makes use of a shift register and a counter, each of which is clocked when a pushbutton input is actuated. The shift register data output actuates the selected position indicator, while the data output from the counter provides a binary count corresponding to the selected switch position. Logic circuitry coupled to the output of the shift register and counter test for the selection of the highest numerical switch position and in response to such condition, enable both the shift register and counter to read in new data on the next actuation of the pushbutton input. The new data loaded on the next pushbutton actuation results in the data output of the selector switch corresponding to the first selected switch position, thus simulating a complete rotation of a rotary type switch.

It is a general object of the present invention to provide an improved rotary-type switch simulator.

It is another object of the present invention to provide an improved rotary-switch simulator which requires less logic to implement than prior art rotary-switch simulators.

These and other objects, features and advantages of the present invention will become more apparent from the detailed description of the preferred embodiment when read in conjunction with the drawing.

SUMMARY OF THE INVENTION

According to the invention, a switching apparatus is provided which simulates a rotary switch in that each time the apparatus is actuated, its output is stepped by one, the actuation corresponding to the turning of a rotary-type switch one position. After a preset maximum count is reached, the output cycles back to the initial starting output, in a fashion analogous to a rotary-type switch being rotated 360 degrees.

The apparatus includes a counter which is clocked by a user actuated pushbutton, the counter output providing a binary value corresponding to the selected switch position. The counter output is fed into a decoder which in response actuates one of a plurality of output lines corresponding to the decoded binary input. Each decoded output actuates a visual indicator, thus identifying the selected switch position.

A detector circuit coupled to the counter's output responds to the counter reaching a maximum count by initiating a load operation to the counter on the next occurrence of a clock input. The data loaded into the counter represents the value in binary of the lowest numbered switch position, normally zero.

BRIEF DESCRIPTION OF THE DRAWING

The FIGURE is a schematic drawing of the preferred embodiment of the present invention.

DETAILED DESCRIPTION OF THE PREFERRED EMBODIMENT

Referring now to the drawing, the counting apparatus 20 is initialized by a System Power-On-Clear signal input to the apparatus 20 via line 22. The power-on-clear signal is supplied as conditions in the using system (not shown) warrant. The receipt of a power-on-clear signal actuates the CLR input to counter 24, which in the preferred embodiment is a type 74161 four bit binary counter. As a result, the counter 24 is initialized to zero, a "00" on counter 24 output bits 1-2 corresponding to the selection of the first one of four possible states.

In order for the counting apparatus 20 to be considered "valid", the apparatus must be enabled by an enable signal from the using system. The enable signal is input to the apparatus 20 on line 26. Thus, counter 24 will not increment in response to a clock (CLK) input unless the counter 24 is enabled. Similarly, if an enable signal is not input to decoder 28, an output line from counter 28 will not be actuated. In the preferred embodiment, decoder 28 is a type 74S138 3-to-8 line decoder/demultiplexor. In the preferred embodiment, the using system actuates the monitor enable signal in response to the using system's operator switching the using system to monitor mode. However, those skilled in the art will appreciate that the enabling of the counting apparatus 20 will be dependent on the use being made of the apparatus 20.

In the preferred embodiment, the present invention is implemented to simulate a four position rotary-type switch. That is, after a power-on clear input the apparatus 20 will indicate unit one selected and provide a corresponding two-bit binary output of "00". Each subsequent actuation of the pushbutton input 30 will advance the output by one. After unit four selection (count="11") has been indicated, the next actuation of the pushbutton input 30 will cause the apparatus 20 to indicate the selection of unit one (count="00"), thus simulating a complete rotation of rotary-type selector switch.

Referring again to the drawing, it will be assumed that an externally supplied system power-on-clear signal has already been provided on input line 22. Additionally, it will be assumed that a properly timed, externally supplied enable signal is provided on input line 26. At counter 24, the power-on-clear signal caused the count to go to zero or "0000" to appear on data out lines 1,2,4 and 8 respectively. Counter 24 data out bits 1 and 2 are input to AND-gate 32, but since the inputs are negative, AND-gate 32 is not made. Counter 24 data out bit positions 1 and 2 also provide inputs to decoder 28 select bit positions A and B respectively. Since all decoder 28 select bits are zero under the present conditions, decoder 28 data out bit Y0 is active. The active Y0 output actuates the PROC1 indicator 34. In the preferred embodiment, indicators (not shown) identical to the PROC1 indicator 34 are connected to the PROC2-PROC4 output lines and are driven by respective drive circuits (not shown) identical to that used to drive indicator 34. Note that the indicators are integral with and backlight the appropriate positions of the switch lens 36 of pushbutton 30. Thus, in the present state of the apparatus 20, selection of unit 1 is indicated, and a corresponding binary (count="00") output signal is provided at the output of counter 24.

Following a system power-on-clear signal, the first actuation of pushbutton 30 causes a clocking signal to be fed from debounce circuit 32 into counter 24 (which is enabled), thus incrementing the count by one, and resulting in counter 24 data out bits 1, 2, 4 and 8 being set to "1000" respectively (count="01"). The counter 24 data out bits 1 and 2 are fed into decoder 28 and cause the Y1 data output to be actuated, all other decoder 28 data out bits being inactive. This causes the PROC1 indicator 34 to go out and actuates an indicator (not shown) identical to indicator 34, but coupled to the PROC2 output and positioned behind the "2" position of lens 36.

On the next (or second) actuation of pushbutton 30, a second clock signal is sent to the CLK input of counter 24. The second CLK signal causes the count in counter 24 to increment by one, so that counter 24 data out bits 1, 2, 4, 8 become "0100" (count="10"). The data out bits of counter 24 are fed into decoder 28 and result in the Y2 output of decoder 28 being actuated, all other decoder 28 data out bits being inactive. This causes the PROC2 indicator to go out and actuates an indicator (not shown) identical to indicator 34, but coupled to the PROC3 output and positioned behind the "3" position of lens 36.

On the next (or third) actuation of pushbutton 30, a third clock signal is sent to the CLK input of counter 24. The third CLK signal causes the count in counter 24 to increment by one, so that counter 24 data out bits 1, 2, 4, 8 become "1100" (count="11"), thus causing AND gate 32 to be made, thus actuating the LOAD input to counter 24. The data out bits of counter 24 are fed into decoder 28 and result in the Y3 output being actuated, all other decoder 28 data out bits being inactive. This causes the PROC3 indicator to go out and actuates an indicator (not shown) identical to indicator 34, but coupled to the PROC4 output and positioned behind the "4" position of lens 36.

On the next (or fourth) actuation of pushbutton 30, a fourth clock signal is sent to the CLK input of counter 24. Since the LOAD input to counter 24 was set as a result of the third (or last) actuation of pushbutton 30, this fourth actuation causes the data out lines of counter 24 to assume the corresponding values on counter 24 data input lines 1, 2, 4 and 8. Thus, counter 24 data out lines 1, 2, 4 and 8 take on the value "0000" (count="00"). In other words, the four bit counter 24 simulates a two bit binary counter since it sequences from "1100" to "0000". The zero data output from counter 24 is input to decoder 28 and results in the Y0 output being actuated, all other decoder 28 data out bits being inactive. This causes the PROC4 indicator to go out and actuates the PROC1 indicator 34.

After the fourth actuation of pushbutton 30, the apparatus 20 is in the same state as after the power-on-clear signal was received. As will be obvious to those skilled in the art, subsequent actuations of pushbutton 30 will cause the original four state output pattern to be repeated, so that the apparatus 20 simulates a four position rotary-type switching mechanism.

Having shown and described the preferred embodiment of the present invention, those skilled in the art will realize that various omissions, substitutions and changes in forms and details of the present invention may be made without departing from the spirit of the invention. It is the intention, therefore, to be limited only as indicated by the scope of the following claims.

What is claimed is:

1. A device for indicating a selected one of a plurality of n sequential states of a selector switch, said device comprising:
   input means for initiating the switching of said selector switch;
   counter means, responsive to said input means, said counter means for storing a value corresponding to a current state which is one of said plurality of n sequential states; and
   load means, responsive to said counter means, said load means for enabling a load operation of said counter means, said load operation causing the value stored in said counter means to be replaced with a value corresponding to an initial one of said plurality of n sequential states upon a count of n−1 from said counter means followed by an actuation of said input means; and wherein the output of said counter means provides a coded representation of said current state of the selector switch.

2. The selector switch in accordance with claim 1 further including decoder means, responsive to said counter means, said decoder means for generating a signal corresponding to said current state.

3. The selector switch in accordance with claim 2 further including a plurality of n indicator means, responsive to said decoder means, said plurality of n indicator means for visually identifying said current state.

4. The selector switch in accordance with claim 2 wherein:
   said counter means includes an m-bit binary counter, where $2^m$ is at least equal to n; and said load means is responsive to said m-bit counter reading a count corresponding to a value of (n−1).

5. The selector switch in accordance with claim 2 or 3 or 4 wherein said decoder means includes an x-to-y line decoder, where x is at least equal to the number of bit positions in said coded representation and y is at least equal to n.

6. The selector switch in accordance with claim 3 wherein said decoder means includes an x-to-y line decoder, where x is at least equal to the number of bit positions in said coded representation and y is at least equal to n, and wherein each one of said plurality of n indicator means is responsive to the presence of a true bit in a corresponding one of the y output positions of said decoder.

7. The selector switch in accordance with claim 2 wherein:
said decoder means includes a x-to-y line decoder, where x is at least equal to the number of bit positions in said coded representation and y is at least equal to n; and
said counter means further includes a data input terminal and a load input terminal, wherein the data representating said intitial state is connected to said data input terminal and loaded into said counter means in response to a signal generated by said load means and applied to said load input terminal followed by an actuation of said input means.

8. The selector switch in accordance with claim 2 further including means, responsive to an externally supplied input signal, said means for enabling and disabling said counter means and said decoder means.

9. The selector switch in accordance with claim 7 wherein said load means includes a logical AND circuit, said logical AND circuit responsive to the data output of said counter means, the output of said logical AND circuit connected to the load input of said counter means.

* * * * *

UNITED STATES PATENT AND TRADEMARK OFFICE
CERTIFICATE OF CORRECTION

PATENT NO. : 4,447,798
DATED : May 8, 1984
INVENTOR(S) : Ira P. Shapiro

It is certified that error appears in the above-identified patent and that said Letters Patent is hereby corrected as shown below:

In Claim 1, line 46, delete "and".

Signed and Sealed this

Fourth Day of September 1984

[SEAL]

*Attest:*

GERALD J. MOSSINGHOFF

*Attesting Officer*     *Commissioner of Patents and Trademarks*